United States Patent [19]

Kennedy et al.

[11] Patent Number: 5,037,621

[45] Date of Patent: Aug. 6, 1991

[54] SYSTEM FOR THE IN-SITU VISUALIZATION OF A SOLID LIQUID INTERFACE DURING CRYSTAL GROWTH

[75] Inventors: James J. Kennedy, Burke, Va.; Sudhir B. Trivedi, Baltimore, Md.

[73] Assignee: The United States of America as represented by the Secretary of the Army, Washington, D.C.

[21] Appl. No.: 433,822

[22] Filed: Nov. 9, 1989

[51] Int. Cl.$^5$ .................. C30B 11/02; C30B 35/00
[52] U.S. Cl. ................. 422/248; 422/106; 422/109; 156/601; 156/616.1; 156/616.4; 156/DIG. 71; 156/DIG. 72; 156/DIG. 77; 156/DIG. 92
[58] Field of Search ............ 156/601, 616.1, 616.2, 156/616.3, 616.4, 616.41, DIG. 71, DIG. 72, DIG. 77, DIG. 92; 422/248, 106, 109

[56] References Cited

U.S. PATENT DOCUMENTS

| | | | |
|---|---|---|---|
| 3,493,770 | 2/1970 | Dessauer et al. | 156/601 |
| 3,740,563 | 6/1973 | Reichard | 156/601 |
| 3,926,566 | 12/1975 | Spurney | 156/DIG. 71 |
| 4,058,429 | 11/1977 | Duncan et al. | 156/601 |
| 4,197,273 | 4/1980 | Dusserre et al. | 156/616.3 |
| 4,350,557 | 9/1982 | Scholl et al. | 156/601 |
| 4,623,423 | 11/1986 | Aubert et al. | 156/DIG. 71 |

FOREIGN PATENT DOCUMENTS

| | | | |
|---|---|---|---|
| 0171694 | 2/1986 | European Pat. Off. | 156/601 |
| 45-6130 | 3/1970 | Japan | 156/601 |

OTHER PUBLICATIONS

Kennedy et al., "Growth and Characterizations of CdZnTe and HgZnTe", Journal of Crystal Growth, vol. 86 (1988), pp. 93–99.

Primary Examiner—Robert Kunemund
Attorney, Agent, or Firm—Milton W. Lee; Anthony T. Lane

[57] ABSTRACT

A system for visualizing the solid-liquid interface of a growing crystal in-situ using a modified vertical Bridgman crystal growth method. An infrared source emits radiation which passes through a furnace window, the crystal material and the growth ampoule which are all transparent to the radiation and is picked up by an IR camera focused on the solid-liquid interface. The IR camera produces radiographs of the solid-liquid interface. The system provides in-situ operation by every radiograph being converted into a visible image in real time by the output from the camera fed to an image processor, including a television monitor and a VHS recorder. A feedback means from the image processor controls the parameters of the growth process such as the furnace temperature and the movement of the growth ampoule.

7 Claims, 2 Drawing Sheets

SYSTEM FOR THE IN-SITU VISUALIZATION OF A SOLID LIQUID INTERFACE DURING CRYSTAL GROWTH

The invention described herein may be manufactured, used, and licensed by the U.S. Government for governmental purposes without the payment of any royalties thereon.

BACKGROUND OF INVENTION

1. Field

The invention relates to a controlled method of crystal growth and specifically to a system of monitoring in-situ the solid-liquid interface of a growing crystal and of providing feedback control means for controlling parameters of various crystal growth processes, such as furnace temperature profile and movement of a growth material ampoule, to produce high quality crystals, with the growth process presented herein as growing compound crystal materials using a modified vertical Bridgman method.

2. Prior Art

Melt growth is one of the most popular methods for growing large crystals of infrared (IR) materials. This method can be accomplished by directional solidification of the molten material by normal freezing or zone melting. Normal freezing can be carried out in several ways with the Bridgman method being one of those widely practiced. Bridgman growth is accomplished by progressive movement of the solid-liquid interface in a controlled manner. It is known that the shape of the solid-liquid interface during solidification affects the compositional homogenity, dislocation density, and mechanical properties of the crystals. Studies to correlate the solid-liquid interface and the properties of resulting crystals exist on very few materials. Even the studies that were made were carried out after the growth. The growth mechanism and the origin of defects are difficult or impossible to analyze without an observation of the solid-liquid interface at the time of the growth process.

A solution to this problem is made possible by the present system for in-situ visualization of a solid-liquid interface during the crystal growth process.

SUMMARY OF THE INVENTION

The system of this invention is based on IR radiography and IR imaging in which an IR source emits radiation through a furnace window and crystal material ampoule which are transparent to the radiation and through the solid-liquid interface of the crystal growth material which is transparent to the radiation and out the furnace window into an IR camera focused inside the crystal growth material on the solid-liquid interface to produce high quality radiographs of the solid-liquid interface. The system operates in-situ by every radiograph being converted into a visible image in real time by the output from the IR camera being fed to an image processor, including a real time television (TV) monitor screen and a VHS recorder to respectively visualize and record for later analysis the solid-liquid interface. A modified vertical Bridgman method was used to prove that the present system functions successfully. However, the system may be used with many other crystal growth processes.

The system is also comprised of a real time feedback means to control parameters of the growth process, such as the temperature profile within the furnace and the movement of the growth ampoule or boule. This feedback means may vary according to which crystal growth methods the system is being used. The feedback means is anticipated as either manually controlled or automatic in some instances. Basically, in a manually controlled feedback as the quality of the solid-liquid interface is visualized on the TV monitor by an operator the feedback control may be slightly adjusted to maintain high quality crystal growth as visualized on the monitor or if the quality is high as monitored the feedback may be entirely passive. Automatic control of the growth process parameters may be provided by the image processor.

Even though the present monitoring system is presented as being used with a modified Bridgman method of crystal growth, the system for maintaining quality growing crystals in-situ may be used with the following crystal growth processes in the automatic feedback means, i.e. for advanced intelligent crystal growth processes in IR materials, such as Group II–VI material compound crystal growth. Some of these processes are traveling heater method (THM); chemical vapor deposition (CVD); metal organic chemical vapor deposition (MOCVD); vapor phase epitaxy (VPE); closed space vapor phase epitaxy (CSVPE); molecular beam epitaxy (MBE) and metal organic molecular beam epitaxy (MOMBE).

One of the growth materials actually used to verify that the system operates successfully was potassium chloride (KCl). The KCl was crystallized in a two-zone heater furnace with the window at the solid-liquid interface and is aligned with the IR source and IR camera between each of the two heater zone. Another growth material used with the system was cadmium zinc telluride (CdZnTe) which was crystallized in a six-zone heater furnace with the window and the IR source and camera positioned in the same proximity to the solid-liquid interface. It is noted that other IR growth materials may be crystalized in this manner as long as the appropriate parameters for the specific materials and the requirements of the IR transmission range of the IR source and the IR detectors are in that range, along with the transparency to that range in any material between the source and camera, such as the window, ampoule, and the furnace. Other Group II–VI compound crystals may be grown in the processes using the in-situ monitoring system, such as cadmium zinc telluride, mercury zinc telluride, cadmium telluride, mercury cadmium telluride, and cadmium telluride selenide.

The system allows in-situ monitor and control of the solid-liquid interface shape of a growing crystal. Information is provided in real time on segregation resulting in homogeneities during the growth of the crystals in a nondestructive and nonintrusive manner, whereas previously the crystals could only be tested after the crystals had been formed, cooled, and taken out of the ampoule.

The invention will become better understood by following the detailed description with reference to the following drawing figures.

DETAILED DESCRIPTION OF THE PREFERRED EMBODIMENT

Figure 1:
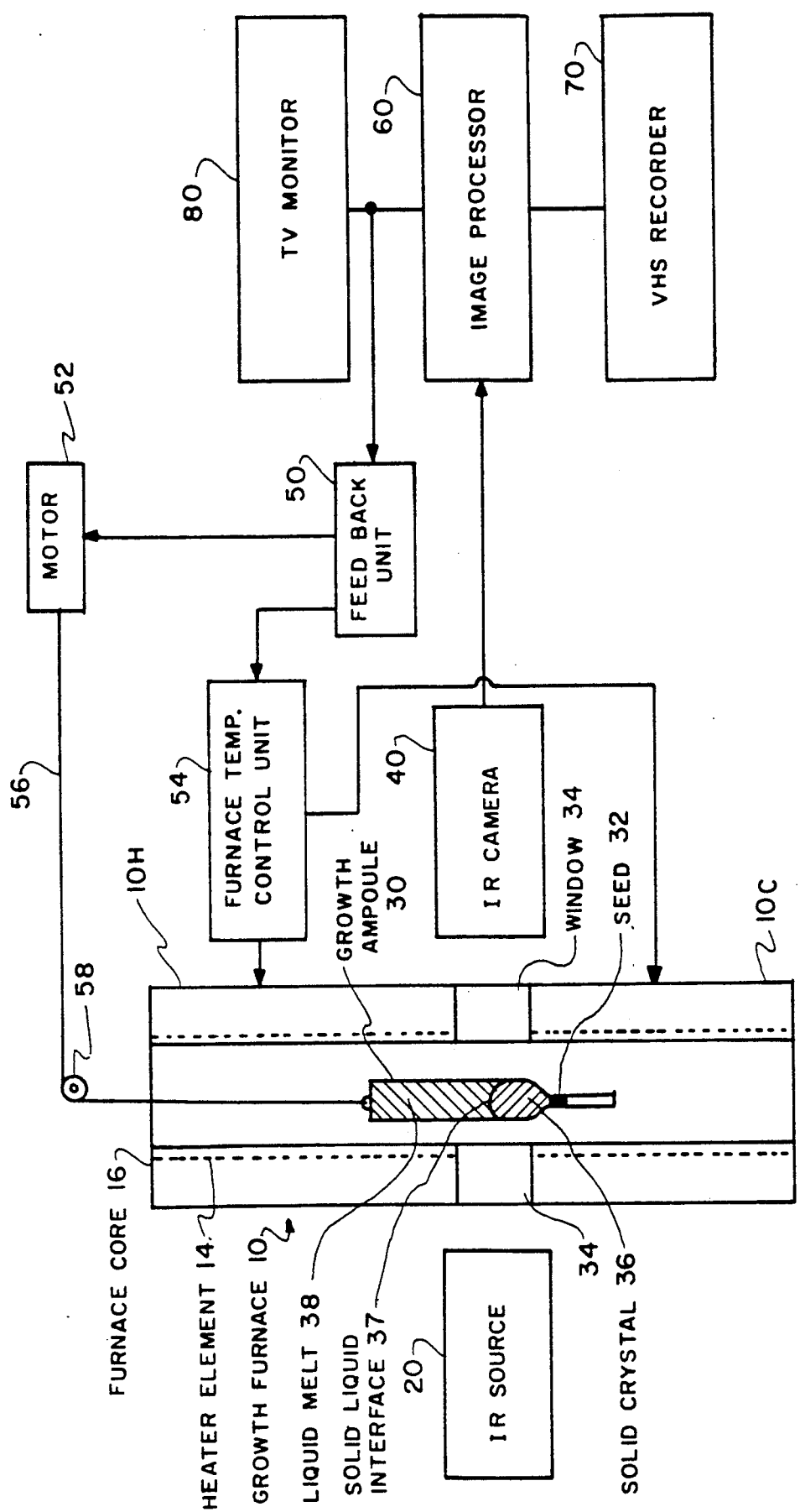
FIG. 1 is a schematic diagram of one embodiment of the invention.

Referring in more detail to FIG. 1, the system for in-situ monitoring is shown. A two heater zone growth furnace 10 is presented, with 10H representing the hot zone and 10C representing the cold zone. It should be noted that there may be multi heater zones and still be consistent with the present system. In fact, the specific crystal growth of cadmium zinc telluride is presented as being in a six zone furnace 11 having a specific internal temperature profile as shown respectively in FIGS. 2A and 2B.

One of the salient features of the present system is a window 34 in the wall of furnace 10 in which the material of 34 is transparent to radiation emitted from an IR source 20 through the window 34 and a growth ampoule 30 containing the growth material and out window 34 into the eye of an IR camera 40. The length of window 34 along the longitudinal axis of 10 is about 2 centimeters. The lens of 40 is focused on the solid-liquid interface 37 of the growing crystal during solidification of the liquid melt growth material 38 into solid crystal 36. A seed crystal 32 is normally used for proper grain growth orientation but is not required and is not critical to operation of the system. The system has a TV monitor 80 for visualizing in-situ the crystal growth at the interface 37 and a feedback means for controlling the parameters to insure quality crystal growth in real time. The exact view on the TV monitor 80 may also be recorded for later review on a VHS recorder 70. The parameters are at least internal temperature of zones 10H and 10C and the rate of movement of the ampoule 30 within furnace 10. The feedback is from an image processor 60 to a feedback unit 50 which indicates to a furnace temperature control unit 54 and to a variable speed bidirectional motor 52 respectively the temperatures to be maintained in the furnace zones and the required speed of movement of growth ampoule 30. The ampoule 30 is connected to motor 52 by a heat resistant cable 56, preferably made of nichrome. Cable 56 may be attached to a hook fastener, or the like, on ampoule 30 and runs around an idler pulley 58 which is positioned over the furnace 10 to allow ampoule 30 to be lowered into the central interior of furnace 10. Even though furnace 10 is shown schematically as open at the upper end, i.e. where the ampoule 30 and cable 56 enter, and at the lower end opposite therefrom, the lower end may or may not be open. Further, furnace 10 may be mounted to some fixure in any conventional manner. Power supplies (not shown) are connected to heater elements 14 in each zone in a multizone furnace wherein the elements 14 carry different heating currents in each zone as appropriate for growth material melt and then crystallization.

As mentioned herein above, potassium chloride (KCl) was used as the crystal growth material to demonstrate that the monitoring and feedback system provides high quality single crystals in-situ. The KCl is an IR material transparent in the range of about 0.2 $\mu$m to 26 $\mu$m. During the solidification process it may be contained in a fused silica or quartz ampoule 30 under high vacuum. Fused silica is transparent to IR radiation in the range of 0.1 $\mu$m to 4.5 $\mu$m. The IR radiation source 20 and the detector sensitivity of IR camera 40 must be chosen so that the ampoule 30 and the KCl growth material along with the window material 34 are transparent to the radiation, used in the radiography, which is emitted from source 20. The window material is chosen as sapphire. The IR source 20 may be a neodymium+:YAG laser. The IR camera may be silicon based charge coupled device (CCD) camera or a mercury cadmium telluride (HgCdTe) CCD camera. The limitation on the upper wavelength of the radiation to be used is the upper limit of the transparency of fused silica and the lower wavelength of the transparency of KCl. These limitations necessitate that the source 20 and detector be in the range of 0.2 to 4.5 $\mu$m. Every material, depending upon its temperature, emits IR radiation. Thus, the IR source 20 may be totally eliminated and the natural IR radiation from the growth material recorded when the sensitivity of the camera 40 detector is good enough for radiographs of the interface of the growth material to be recorded therein. For example, since the HgCdTe based camera is temperature sensitive, interface 37 can be visualized in real time even without an external source 20 of IR radiation. These radiographs are produced by the IR imaging technique in which two dimensional spatial variation in thermal IR radiosity from the solid-liquid interface 37 is converted into a two dimensional thermal map of the same scene.

The wavelength of radiation peaks for growth material held at temperature T according to Wein's Law as shown, $$\text{PEAK } \lambda = \frac{2898 \, (\mu m \, °K.)}{T(°K.)} . \qquad (1)$$

If the growth material is transparent to this $\lambda$ PEAK and to neighboring wavelengths on the blackbody spectral distribution curve corresponding to its temperature, IR imaging can produce two dimensional thermograms containing super imposed three dimensional information of the bulk growth material at high temperature. This technique may well be described as infrared autoradiography. The melting point of potassium chloride (KCl) is about 770° C. At this temperature, the radiation emitted from KCl will peak at about 2.8 $\mu$m. Typical spectral distribution of energy radiated from a blackbody at this temperature clearly indicates that at its melting point KCl will emit radiations with sufficient energy in the 3-5 $\mu$m range. The radiations can be easily detected using a liquid nitrogen cooled mercury cadmium telluride (HgCdTe) detector based IR imaging system with camera 40 which is capable of operating in the spectral bandpass of 3-14 $\mu$m. The IR detecting and imaging system may be an Inframetrics model 600 IR imaging radiometer. The features of this particular radiometer are that it is TV compatible and is comprised of a 3-5 $\mu$m mid wave detector, 3 power telescope, a 12 inch close up lens, and has capability of real time image averaging and frame freeze. The image processor 60 was used to enhance the contrast of recorded IR images and make still photographs from the VHS recorder 70. The fused silica growth ampoule 30, which contains the KCl growth material, is transparent in the 0.2-4.5 $\mu$m range. The IR radiation emitted by KCl in the molten state 38 as well as in the solid state 36 at interface 37 can be used for thermal imaging of interface 37 in real time while the crystal is being grown.

The two zone furnace 10 was constructed by winding a coil, forming a plurality of heater elements 14, on a furnace core 16. The core 16 is 22 millimeter inside diameter and has 1.5 millimeter wall thickness. The coil heat elements 14 are preferable nichrome and the core is preferably fused silica. However, the elements 14 may be platinum 40% and rhodium and the core may be high purity alumina. The nichrome heater coil 14 was covered with alumina cement. A paste of alumina cement was formed in sodium silicate solution and applied on the heater zones, i.e. the hot zone 10H and cold zone 10C, while the window 34 region was covered with masking tape. After applying a 1.5 centimeter thick layer coat of alumina cement on the interior heater element 14 zones, it was allowed to dry for 24 hours. The masking tape is then removed and the window 34 cleaned with acetone. Zones 10H and 10C were then slowly heated up to 120° C. by passing electrical current through them using variacs in a controlled manner and left at that temperature for 24 hours.

The KCl growth material was vacuum sealed in an ampoule 30 of 1 centimeter in diameter with 1 millimeter wall thickness. A fused silica rod of about 25 centimeters in length was attached coaxially to the sealed end of the ampoule and a hook was formed at the other end of the rod. The nichrome cable 56, which is connected to variable speed motor 52 by way of pulley 58, is appropriately attached to the hook on ampoule 30.

Ampoule 30 is inserted into furnace 10 by being lowered by motor 52. Both zones 10H and 10C are heated up to the 770° C. melting temperature for KCl and held there for 24 hours. During the melting process of the KCl the detector in the imaging system is cooled to liquid nitrogen temperature and the camera is precisely focused through window 34 at the growth ampoule 30. The colder zone 10C is then gradually cooled while zone 10H remains at 770° C. By use of the silica rod attached to ampoule 30 and the cable 56 attached to the hook on the rod and to motor 52 the ampoule 30 is lowered into the window 34 region. The process of directional solidification by the melt being directionally cooled and solidified precisely at the point of focus of camera 40 may be directly observed on TV monitor 80, which is connected to camera 40 and may be recorded on tapes in the VHS recorder 70. The image processor 60 senses the quality of the solid-liquid interface 37 and provides data to feedback unit 50 which in turn controls the motor 52 speed and the furnace temperatures of zones 10H and 10C through a furnace temperature control unit 54. Realistically, since an operator visualizes the growing crystal in real time by viewing the monitor 80 the operator may vary the controls to the furnace 10 and motor 52 to maintain high quality crystal growth.

Figure 2B:
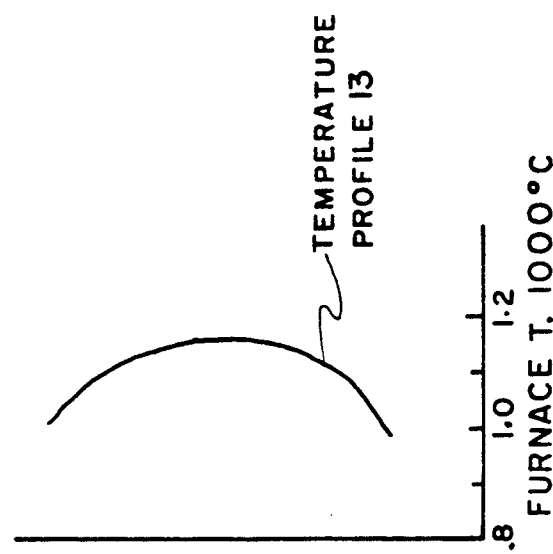
FIG. 2B shows schematically a temperature gradient of the multizone furnace of FIG. 2A.
Figure 2A:
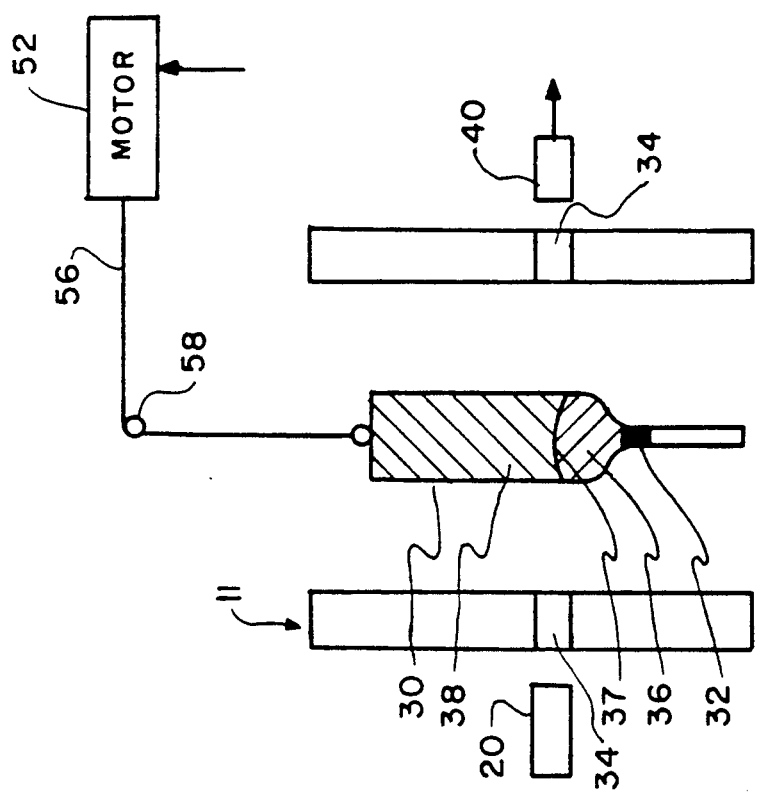
FIG. 2A illustrates a partial schematic diagram of a multizone furnace variation of the embodiment of FIG. 1.

Refer now to FIGS. 2A and 2B for the presentation of a multizone furnace 11 used to establish a temperature profile 13 of the interior of furnace 11 during a similar modified vertical Bridgman growth. Elements of the illustration of FIG. 1 are the same and have the same identifing numbers, with window 34 positioned at the interface 37 as required for proper operation. The embodiment of FIGS. 2A and 2B should be known as only a modification of FIG. 1 and is also comprised of the source 20 which emits radiation transparent to the window 34 and the ampoule and growth material, camera 40, image processor 60, monitor 80, recorder 70, feedback unit 50, and an appropriate furnace temperature control unit 54 for controlling all of the heater zones of the multizone furnace 11 separately to establish profile 13. One of the coinventors, James J. Kennedy, is a coauthor of a publication entitled, "Growth and Characterization of $Cd_{1-x}Zn_xTe$ and $Hg_{1-y}Zn_yTe$" published in Journal of Crystal Growth 86 (1988) 93.

The authors presentation of the growth of $Cd_{1-x}Zn_xTe$ in this article will be used and elaborated on to show how the present method of in-situ monitoring can be used to monitor the growth in real time rather than to test the crystals only after their growth as previously carried out. In this instance, multizone furnace is presented as a six zone furnace and will be explained as a six zone furnace.

The ampoule 30 with seed 32 of $Cd_{0.8}Zn_{0.2}Te$ and CdZnTe growth charge of zinc mole fraction 'x' therein is lowered into furnace 11 and the furnace temperature is gradually raised to above the melting point of the CdZnTe growth charge, i.e. to 1120° C. for about 24 hours. All of the six zone are raised to 1120° C. The zones are then changed to form the temperature profile 13 and the ampoule 30 is positioned where the interface 37 is at window 34. Window 34 is between two adjacent heater zones and is formed as explained herein above for the two zone furnace. About 1 hour is required to adjust all of the six equally spaced heater elements for manual or automatic feedback to maintain that profile. The lower heater zones, i.e. the zones at the cooling or solidification crystal 36 end of ampoule 30 and below, are at about 975° C. to 1092° at the interface 37 while the upper zones are maintained at 1120° C. When crystalization begins as will be present on monitor 80 the ampoule 30 is first lowered at the rate of 3 millimeters per hour for about 2 hours to choose the desired grain or seed in. Ampoule 30 is then slowed to 1 millimeter per hour over a 4 hour period. The growth rate will remain at about 1 millimeter per hour for the remainder of the growth cycle. Not only the crystal growth cycle but the post anneal time and other features may be monitored in-situ to provide high quality $Cd_{.955}Zn_{.045}Te$ or $Cd_xZn_xTe$ crystals.

The present system of in-situ monitoring of growing crystals in real time is not intended to be limited to specific example growth materials detailed above but may be used with the crystal growth process of various growth materials in which radiography may be produced therefrom.

We claim:

1. A system of in-situ monitoring of the interior of crystal growth material and control of a solid-liquid interface shape of the growing crystal, said system comprising the steps of:

producing infrared radiographs for infrared imaging of said solid-liquid interface of said crystal growth material growing in a growth ampoule by providing an infrared source and an infrared camera in line with elements which are transparent to radiation emitted from said infrared source, said elements comprised of a furnace window in the wall of a crystal growth furnace and said growth ampoule and said crystal growth material therein in which said infrared source emits radiation in through said furnace window, said growth ampoule and said solid-liquid interface of said crystal growth material, and out through furnace window and into said infrared camera wherein said infrared camera is in sharp focus inside said crystal growth material on the solid-liquid interface wherein the infrared radiation detected by said infrared camera as thermal infrared radiosity from said solid-liquid interface is converted into a two dimensional thermal map of said solid-liquid interface on the interior of said crystal growth material;

converting said two dimensional thermal map into a visible image in realtime of said thermal infrared radiosity from said solid-liquid interface and feeding the converted visible image to an image processor for displaying on a television monitor in realtime and for recording; and providing feedback means for controlling growth parameters of said process, said feedback means comprised of controlling the temperature in said growth furnace and movement of said ampoule within said growth furnace to maintain the growth of said solid-liquid interface precisely at the focus of said infrared camera.

2. A system as set forth in claim 1 wherein said step of providing a feedback means is by an automatic feedback means comprised of a feedback unit which controls the movement of said ampoule and the temperature in various zones of said multizone heater furnace.

3. A system as set forth in claim 1 wherein said step of providing feedback means is by an operator visualizing in-situ said radiographs on said television monitor and manually controlling the temperature in various zones of a multizone heater furnace and the movement of said ampoule.

4. A system as set forth in claim 1 wherein the step of producing radiographs is by providing a modified vertical Bridgman crystal growth process.

5. A system as set forth in claim 4 wherein the step of producing radiographs is by the use of potassium chloride crystal growth material in a vacuum sealed fused silica ampoule inserted into a two zone heater growth furnace at a furnace window made of sapphire in which potassium chloride is transparent to radiation in the 0.2 $\mu$m to 26 $\mu$m wavelength range and fused silica is transparent to radiation in the 0.1 $\mu$m to 4.5 $\mu$m wavelength range with sapphire transparent to radiation within these ranges.

6. A system as set forth in claim 5 wherein the step of producing radiographs is comprised of providing as an infrared source a neodymium+:YAG laser and a mercury cadmium telluride detector charge coupled device camera for detecting infrared radiation from said infrared source passing through said potassium chloride growth material, said fused silica ampoule, and said sapphire window.

7. A system as set forth in claim 4 wherein the step of producing radiographs is by the use of cadmium zinc telluride crystal growth material in a vacuum sealed quartz ampoule insert into a six zone heater growth furnace at a furnace window made of sapphire and is comprised of providing a neodymium+:YAG laser infrared source and a mercury cadmium telluride detector charge coupled device camera for detecting infrared radiation from said infrared source passing through said cadmium zinc telluride growth material, said quartz ampoule, and said sapphire window.

* * * * *